United States Patent [19]

Niwano et al.

[11] Patent Number: 4,857,478
[45] Date of Patent: Aug. 15, 1989

[54] METHOD OF MANUFACTURING A SEMICONDUCTOR MEMORY DEVICE

[75] Inventors: Kazuhito Niwano; Tatsuhiko Ikeda, both of Itami, Japan

[73] Assignee: Mitsubishi Denki Kabushiki Kaisha, Tokyo, Japan

[21] Appl. No.: 267,374

[22] Filed: Nov. 4, 1988

[30] Foreign Application Priority Data

Apr. 26, 1988 [JP] Japan .................. 63-104714

[51] Int. Cl.[4] .......................... H01L 21/265
[52] U.S. Cl. .......................... 437/61; 437/31; 437/52; 437/67; 437/69; 437/72; 437/228; 437/33
[58] Field of Search .......... 437/31, 52, 56, 57, 437/59, 61, 67, 69, 228

[56] References Cited

U.S. PATENT DOCUMENTS

| 4,104,086 | 8/1978 | Bomclur et al. | 437/67 |
| 4,238,278 | 12/1980 | Amtipov | 437/67 |
| 4,434,543 | 3/1984 | Schwabe et al. | 437/56 |
| 4,481,704 | 11/1984 | Darley et al. | 437/59 |
| 4,509,249 | 8/1985 | Goto et al. | 437/67 |
| 4,516,316 | 5/1985 | Haskell | 437/57 |
| 4,536,947 | 8/1985 | Bohn et al. | 437/57 |

FOREIGN PATENT DOCUMENTS 181552 10/1984 Japan .
150266 7/1986 Japan .

OTHER PUBLICATIONS

IEEE Cat. No. 85 CH 2125-3; 1985 Symposium on VLSI Technology (Digest of Technical Papers), May 14-16, 1985, Kobe, Japan.

Primary Examiner—Brian E. Hearn
Assistant Examiner—Tom Thomas
Attorney, Agent, or Firm—Oblon, Spivak, McClelland, Maier & Neustadt

[57] ABSTRACT

According to the present invention, a second conductivity type subcollector layer and a second conductivity type collector layer are sequentially formed on a first conductivity type semiconductor substrate and thereafter first and second insulation layers are simultaneously formed in a region corresponding to a memory element area and regions corresponding to prescribed regions of a peripheral circuit area within an upper layer part of the second conductivity type collector layer. Thus, the degree of integration is improved by simplification of manufacturing steps and reduction of the number of masking times.

4 Claims, 11 Drawing Sheets

METHOD OF MANUFACTURING A SEMICONDUCTOR MEMORY DEVICE

BACKGROUND OF THE INVENTION
1. Field of the Invention

The present invention relates to a method of manufacturing a semiconductor memory device, and more particularly, it relates to a method of manufacturing a bipolar semiconductor memory device.

2. Description of the Background Art

A bipolar semiconductor memory device generally comprises memory element group and peripheral circuits such as an I/O circuit. The memory element group comprises memory cells which are arranged in the form of a matrix in a memory element area. Each memory cell is provided with a flip-flop circuit comprising a bipolar transistors. The peripheral circuits are arranged in a peripheral circuit area.

In the aforementioned memory cells, soft errors are easily caused by alpha rays incident upon the semiconductor memory device. Namely, when a prescribed amount of electron-hole pairs are generated upon incidence of the alpha rays in the semiconductor memory device, data stored in the memory cells are inverted, to thereby cause soft errors. The amount of such electron-hole pairs required for inverting the data stored in the memory cells is called a critical charge amount. Thus, it is effective to increase the critical charge amount in order to prevent the soft errors.

In recent years, however, such a bipolar semiconductor memory device has been increasingly refined in order to cope with requirement for implementation of the bipolar semiconductor memory device with a higher degree of integration and a higher operating speed. Thus, the amount of charges storable in the memory cells has been reduced, and the critical charge amount is accordingly decreased. In other words, the memory cells have increasingly suffered from soft errors caused by alpha rays with increase in the degree of integration and the operating speed of the bipolar semiconductor memory device.

In order to solve such a problem, collector layers of transistors forming memory cells have been generally reduced in thickness to increase base-to-collector parasitic capacitance, to thereby increase the critical charge amount of the memory cells. In more concrete terms, the bipolar semiconductor memory device has been generally manufactured through the following procedure:

FIGS. 1A to 1E are sectional views for illustrating a method of manufacturing a conventional bipolar semiconductor memory device.

Figure 1A:
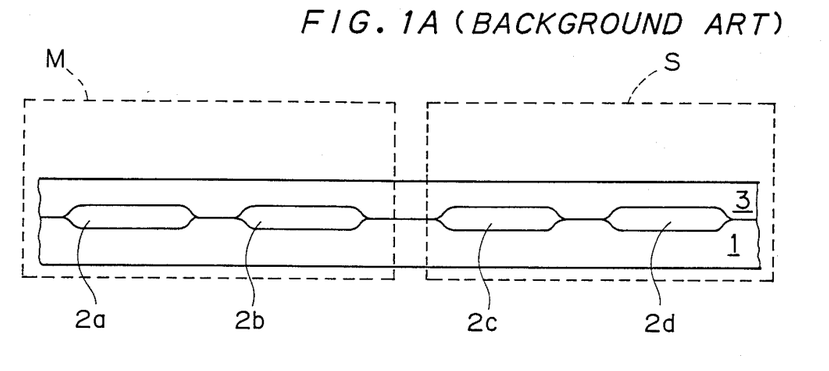
FIGS. 1A to 1E are sectional views for illustrating a method of manufacturing a conventional bipolar semiconductor memory device.

(1) First, N+-type subcollector regions 2a to 2d are formed at regular intervals in an upper layer part of a P−-type semiconductor substrate 1 by ion implantation, selective diffusion or the like, as shown in FIG. 1A. Then, an N−-type collector layer 3 is epitaxially grown on the P−-type semiconductor substrate 1 and the N+-type subcollector regions 2a to 2d. Referring to FIG. 1A, symbols M and S indicate a memory element area and a peripheral cricuit area respectively.

Figure 1B:
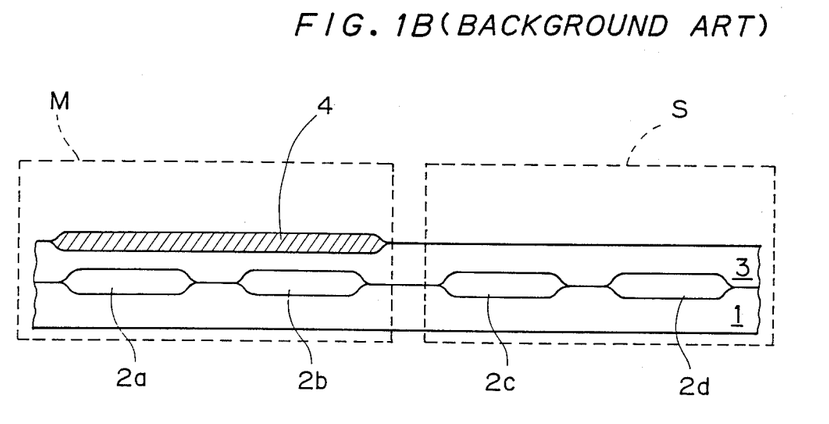

(2) Then, an SiO$_2$ layer 4 is formed in an upper layer part of the N−-type collector layer 3 corresponding to the memory element area M by well-known LOCOS (local oxidation of silicon) process, as shown in FIG. 1B.

Figure 1C:
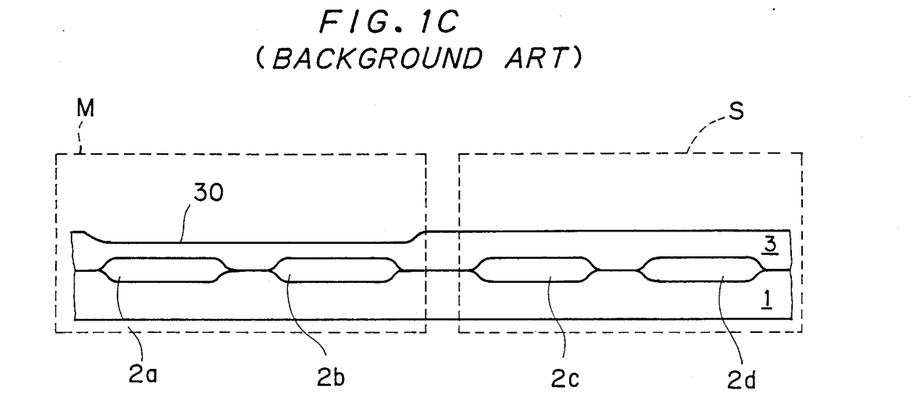

(3) Thereafter the SiO$_2$ layer 4 is entirely removed, as shown in FIG. 1C. Thus, a cavity 30 is formed into an upper side part of the N−-type collector layer 3 corresponding to the memory element area M, to thereby reduce thickness of the N−-type collector layer 3.

Figure 1D:
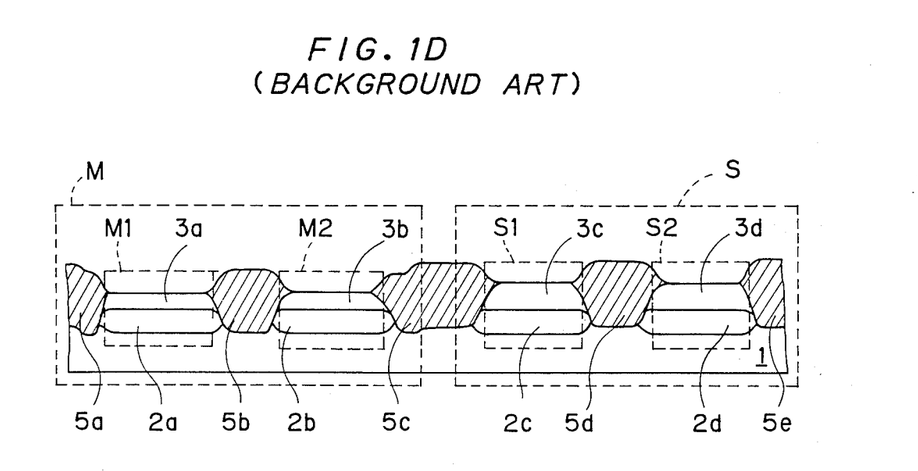

(4) Then, SiO$_2$ layers 5a, 5b, 5c, 5d and 5e are respectively formed by the LOCOS process, and element forming regions M1, M2, S1 and S2 are defined between adjacent pairs of the SiO$_2$ layers 5a, 5b, 5c, 5d and 5e, as shown in FIG. 1D. Namely, the element forming region M1 formed by the N+-type subcollector region 2a and an N−-type collector region 3a is isolated from its peripheral region by the SiO$_2$ layers 5a and 5b. In a similar manner, the element forming regions M2, S1 and S2 are also isolated from peripheral regions thereof, respectively.

Figure 1E:
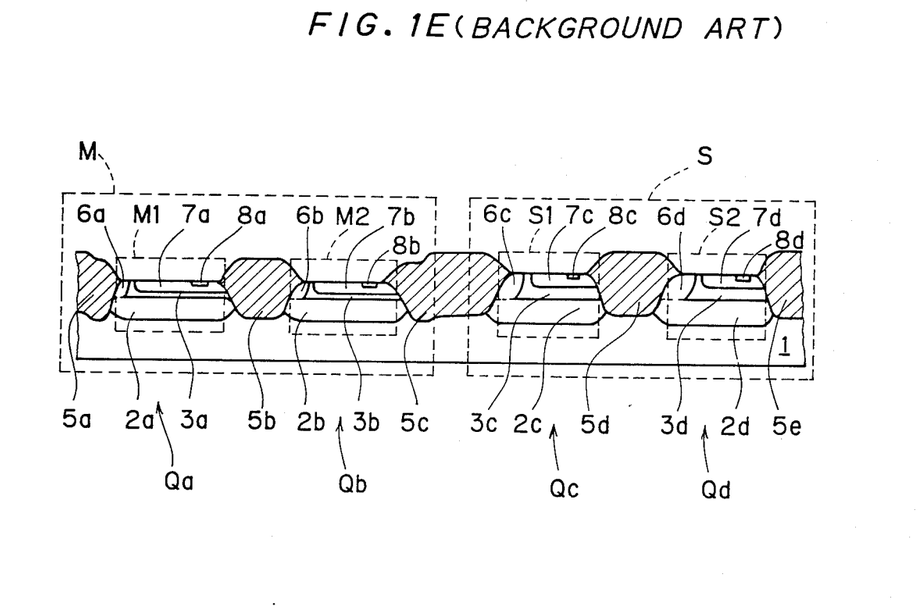

(5) Finally, bipolar transistors for forming memory cells are respectively provided in the element forming regions M1 and M2, while elements, such as transistors and resistors, for forming the peripheral circuit are respectively provided in the element forming regions S1 and S2 by well-known technique, as shown in FIG. 1E. Referring to FIG. 1E, for example, NPN bipolar transistors $Q_a$ and $Q_b$ for forming memory cells are provided in the element forming regions M1 and M2, while NPN bipolar transistors $Q_c$ and $Q_d$ for forming peripheral circuits are provided in the element forming regions S1 and S2, respectivly. To say more precisely, and N+-type subcollector region 6a is formed in a part of the N−-type collector region 3a to be coupled with the N+-type subcollector region 2a. Further, a P+-type base region 7a is formed in an upper layer part of the N−-type collector region 3a, while an N+-type emitter region 8a is formed in an upper layer part of the P+-type base region 7a. Namely, the NPN bipolar transistors $Q_a$ comprises the N−-type collector region 3a, the P+-type base region 7a and the N+-type emitter region 8a. Similarly to the NPN bipolar transistors $Q_a$, the NPN bipolar transistors $Q_b$, $Q_c$ and $Q_d$ are formed in the element forming regions M2, S1 and S2, respectively. Components of the NPN bipolar transistors $Q_b$, $Q_c$ and $Q_d$ are indicated by corresponding numerals, and redundant description thereof is omitted.

As hereinabove described, the collector regions 3a, 3b (N−-type collector layer 3) of the transistors $Q_a$ and $Q_b$ for forming the memory cells are respectively reduced in thickness by the steps (2) (FIG. 1B) and (3) (FIG. 1C), to thereby increase base-to-collector parasitic capacitance. Consequently, the critical charge amount is also increased, and occurrence of soft errors is accordingly reduced.

In the aforementioned manufacturing method, however, the element forming regions M1, M2, S1 and S2 are defined between adjacent pairs of the SiO$_2$ layers 5a, 5b, 5c, 5d and 5e formed by the LOCOS process in the step (4), whereby bird's beaks are caused on respective both end portions of the SiO$_2$ layers 5a, 5b, 5c, 5d and 5e formed by the LOCOS process to narrow the N−-type collector regions 3a, 3b, 3c and 3d, as shown in FIG. 1D. Consequently, the degree of integration of the semiconductor memory device cannot be improved.

Therefore, a trench isolation process has been proposed as a new element isolation method for taking the place of the LOCOS process. In more concrete terms, a bipolar semiconductor memory device is manufactured in the following procedure:

FIGS. 2A to 2E are sectional views for illustrating a method of manufacturing the bipolar semiconductor memory device according to such a proposal.

Figure 2A:
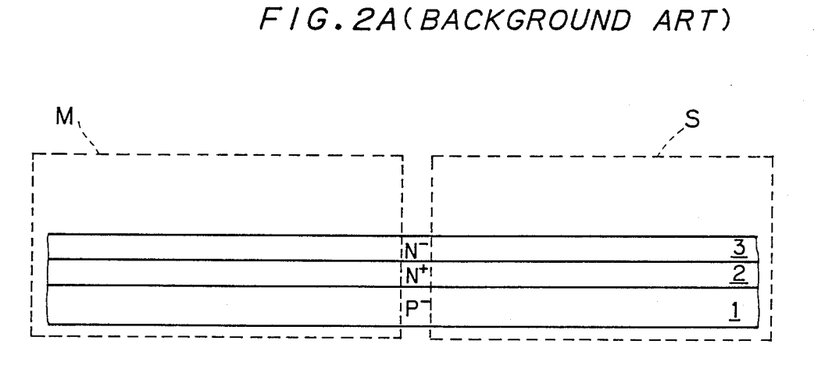
FIGS. 2A to 2E are sectional views for illustrating a method of manufacturing a bipolar semiconductor memory device according to a proposal.

(1) First, an N+-type subcollector layer 2 is formed in an upper layer part of a P−-type semiconductor substrate 1 by ion implantation, selective diffusion or the like, and then an N−-type collector layer 3 is epitaxially grown on the N+-type subcollector layer 2, as shown in FIG. 2A.

Figure 2B:
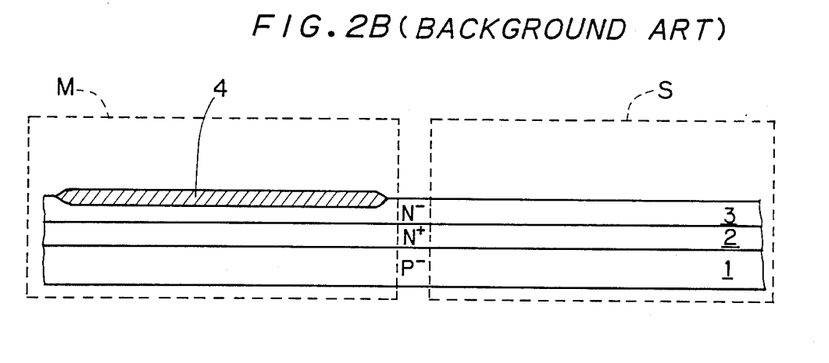

(2) Then, an $SiO_2$ layer 4 is formed by the LOCOS process in an upper layer part of the N−-layer collector layer 3 corresponding to a memory element area M, as shown in FIG. 2B.

Figure 2C:
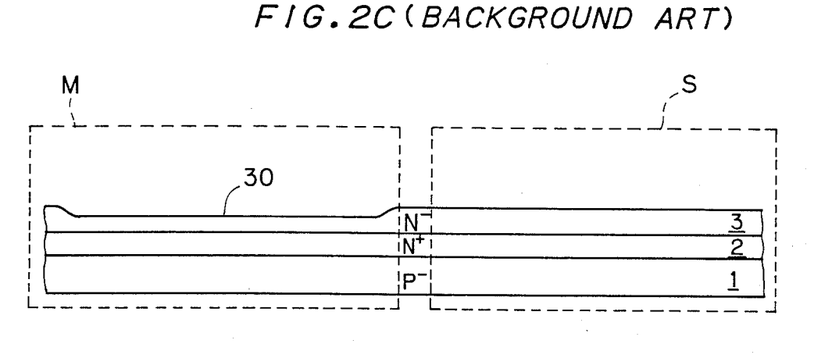

(3) Thereafter the $SiO_2$ layer 4 is entirely removed as shown in FIG. 2C, to thereby form a cavity 30 in the N−-type collector layer 3 corresponding to the memory element area M. Thus, thickness of the N−-type collector layer 3 corresponding to the memory element area M is reduced.

Figure 2D:
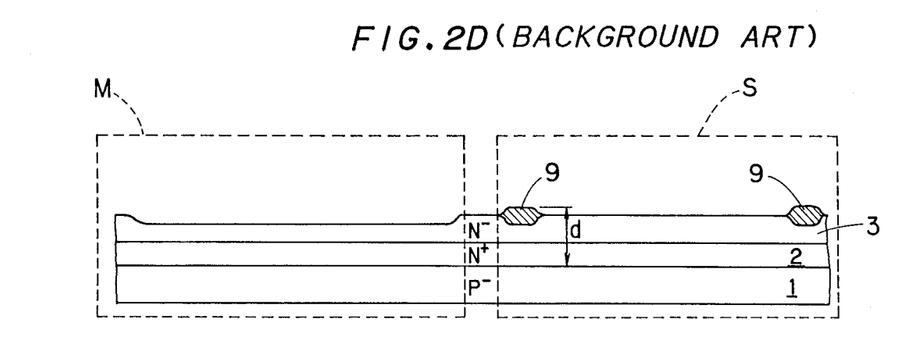

(4) Then, $SiO_2$ layers 9 are respectively formed in prescribed regions of the upper layer part of the N−-type collector layer 3 corresponding to a peripheral circuit area S by the LOCOS process, as shown in FIG. 2D. The regions provided with the $SiO_2$ layers 9 are adapted to serve as wiring regions of the semiconductor memory device in a later step, and wires are so provided on the $SiO_2$ layers 9 as to increase the distance d between the semiconductor substrate 1 and the wires. Consequently, parasitic capacitance across the semiconductor substrate 1 and the wires is reduced, and it is accordingly possible to get the semiconductor memory device of high-speed operation. In the aforementioned conventional method shown in FIGS. 1A to 1E, the $SiO_2$ layers 5c and 5e formed in the step (4) (FIG. 1D) have the function similarly to the $SiO_2$ layers 9.

Figure 2E:
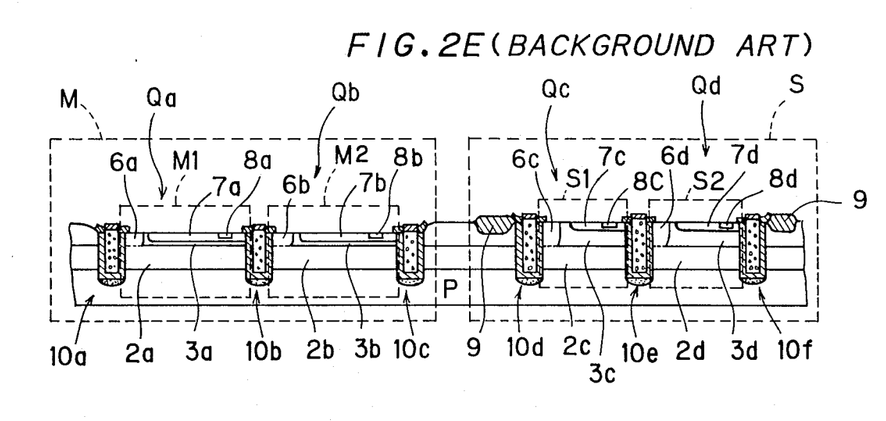

(5) Thereafter trench isolation members 10a to 10f are formed in prescribed positions of the memory element area M and the peripheral circuit area S by a well-known trench isolation method as shown in FIG. 2E, while element forming regions M1, M2, S1 and S2 are defined between adjacent pairs of the trench isolation members 10a to 10f. Namely, the element forming region M1 comprising an N+-type subcollector region 2a and an N−-type collector region 3a is isolated from its peripheral region by the trench isolation members 10a and 10b. Similarly, the element forming regions M2, S1 and S2 are also isolated from peripheral regions thereof, respectively.

(6) Finally, bipolar transistors for forming memory cells are respectively provided in the element forming regions M1 and M2, while elements, such as transistors, resistors or the like, for forming the peripheral circuit are respectively provided in the element forming regions S1 and S2 by well-known technique similarly to the step (5) (FIG. 1E) of the aforementioned conventional method, as shown in FIG. 2E. Referring to FIG. 2E, NPN bipolar transistors $Q_a$ and $Q_b$ for forming memory cells are provided in the element forming regions M1 and M2, while NPN bipolar transistors $Q_c$ and $Q_d$ for forming peripheral circuits are provided in the element forming regions A1 and S2, respectively, similarly to the case of FIG. 1E. The NPN bipolar transistors $Q_q$ to $Q_d$ shown in FIG. 2E are identical to those of FIG. 1E, and hence redundant description is omitted.

Thus, according to the method of manufacturing a semiconductor memory device shown in FIGS. 2A to 2E, collector regions 3a and 3b (N−-type collector layer 3) of the transistors $Q_a$ and $Q_b$ for forming the memory cells are reduced in thickness through the steps (2) (FIG. 2B) and (3) (FIG. 2C), to thereby increase base-to-collector parasitic capacitance similarly to the aforementioned conventional method. Consequently, the critical charge amount is also increased, and occurrence of soft errors is accordingly reduced. Further, the degree of integration of the semiconductor memory device can be improved since the trench isolation members 10a to 10f are formed in the step (5) (FIG. 2E) to isolate the element forming regions M1, M2, S1 and S2 from each other.

In the method of manufacturing a semiconductor memory device according to the aforementioned proposal, however, the steps of manufacturing the semiconductor memory device are complicated since the step (2) (FIG. 2B) of forming the $SiO_2$ layer 4 and the step (4) (FIG. 2D) of forming the $SiO_2$ layers 9 are separately performed, whereby the manufacturing efficiency of the semiconductor memory device is lowered.

In general, mask alignment must be performed in consideration of errors following thereto, and hence it is necessary to perform pattern design with allowance for such errors caused upon mask alignment. Therefore, the number of times of mask alignment is preferably reduced to the minimum in order to improve the degree of integration of the semiconductor memory device. In the method of manufacturing a semiconductor memory device according to the aforementioned proposal, however, mask alignment is required at least twice since the $SiO_2$ layer 4 and the $SiO_2$ layers 9 are separately formed, and hence the degree of integration of the semiconductor memory device is reduced. In order to solve such a problem, the ste (4) (FIG. 2D) of forming the $SiO_2$ layers 9 may be omitted. However, the $SiO_2$ layers 9 are adapted to reduce parasitic capacitance across the semiconductor substrate 1 and the wires to contribute to high-speed operation of the semiconductor memory device as hereinabove described. Thus, it is not preferable to omit the step (4) (FIG. 2D) since characteristics of the semiconductor memory device will be degraded by such omission of the step (4).

SUMMARY OF THE INVENTION

The present invention is directed to a method of manufacturing a semiconductor memory device which comprises a memory element area formed by a plurality of bipolar transistors in a first area of a first conductivity type semiconductor substrate and a peripheral circuit are formed by a plurality of circuit elements in a second area of the semiconductor substrate. The method of manufacturing a semiconductor memory device according to the present invention includes a first step of preparing the semiconductor substrate, a second step of forming a second conductivity type subcollector layer on the semiconductor substrate, a third step of forming a second conductivity type collector layer on the second conductivity type subcollector layer, a fourth step of simultaneously forming first and second insulation layers on a region corresponding to the memory element area and regions corresponding to prescribed regions of the peripheral circuit area within an upper layer part of the second conductivity type collector layer, a fifth step of selectively removing the first insulation layer and a sixth step of isolating regions for forming the plurality of bipolar transistors from each other as well as isolating regions for forming the plurality of circuit elements from each other by trench isolation.

A primary object of the present invention is to provide a method of manufacturing a semiconductor memory device, which can efficiently manufacture a semiconductor memory device operating at a high speed under a high degree of integration substantially with no soft errors caused by alpha rays.

These and other objects, features, aspects and advantages of the present invention will becomre more apparent from the following detailed description of the present invention when taken in conjunction with the accompanying drawings.

DESCRIPTION OF THE PREFERRED EMBODIMENT

FIGS. 3A to 3L are sectional views showing an embodiment of a method of manufacturing a bipolar semiconductor memory device according to the present invention.

Figure 3A:
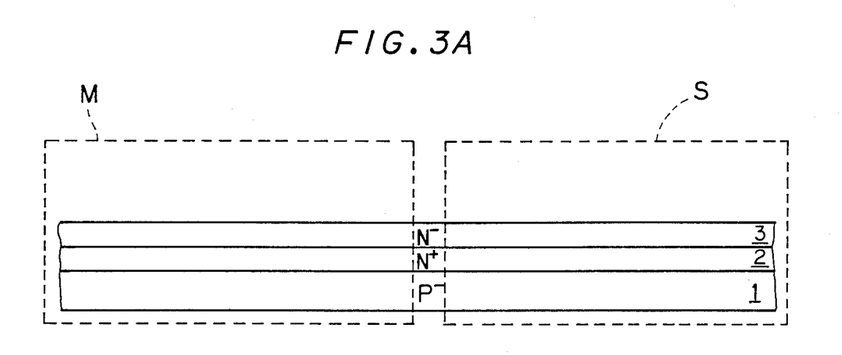
FIGS. 3A to 3L are sectional views showing an embodiment of a method of manufacturing a bipolar semiconductor memory device according to the present invention.

(1) First, an $N^+$-type subcollector layer 2 is formed in an upper layer part of a $P^-$-type semiconductor substrate 1 by ion implantation, selective diffusion or the like, and an $N^-$-type collector layer 3 is epitaxially grown on the $N^+$-type subcollector layer 2, as shown in FIG. 3A.

(2) Then, $SiO_2$ layers are simultaneously formed in a region corresponding to a memory element area M and regions corresponding to prescribed regions of a peripheral circuit area S within an upper layer part of the $N^-$-type collector layer 3, as shown in FIGS. 3B to 3E.

Figure 3B:
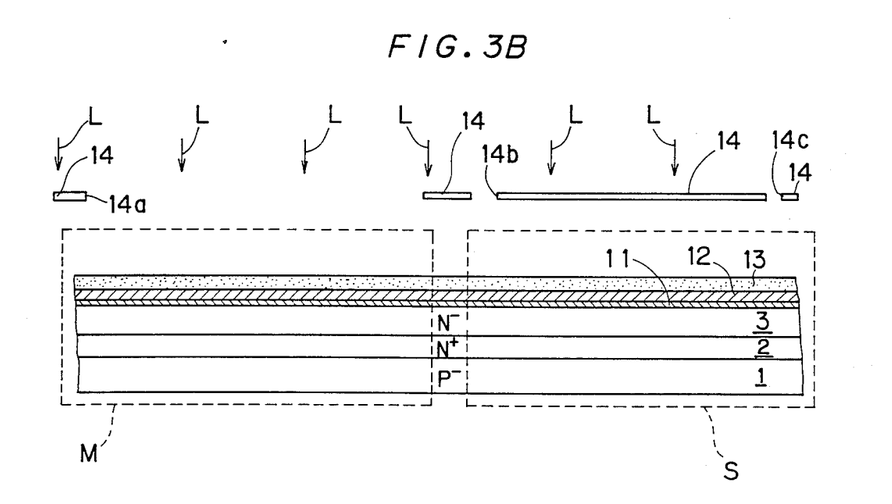
Figure 3C:
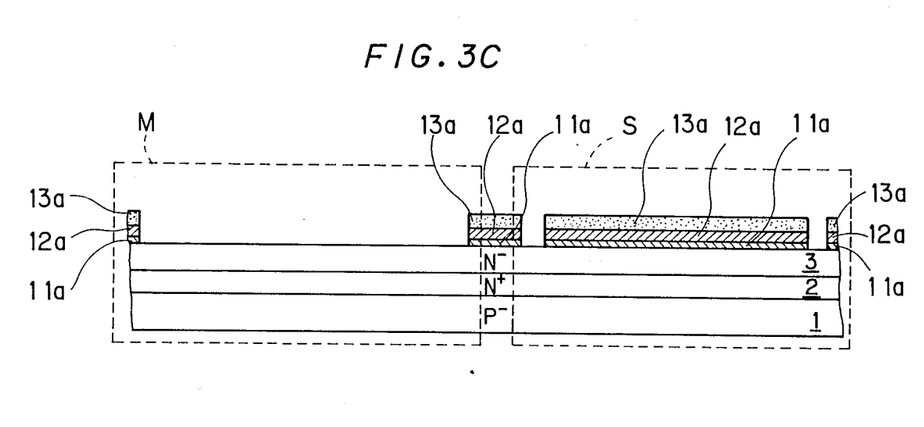
Figure 3D:
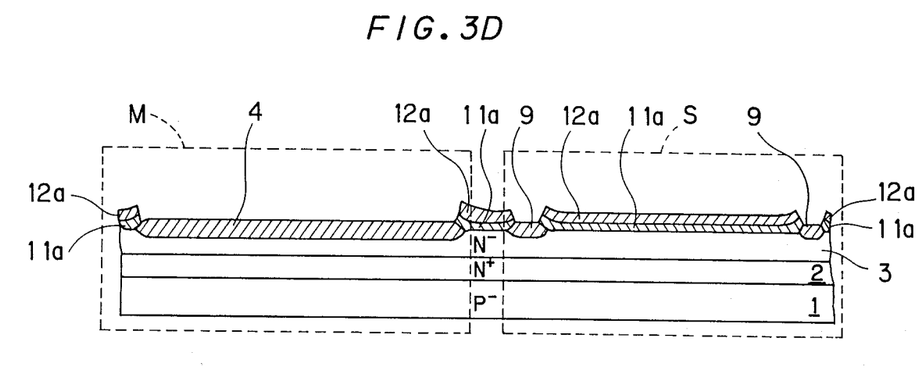
Figure 3E:
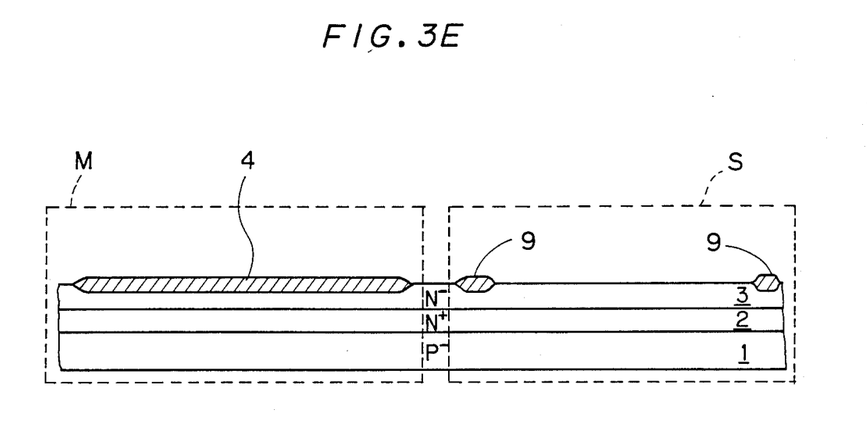
Figure 3F:
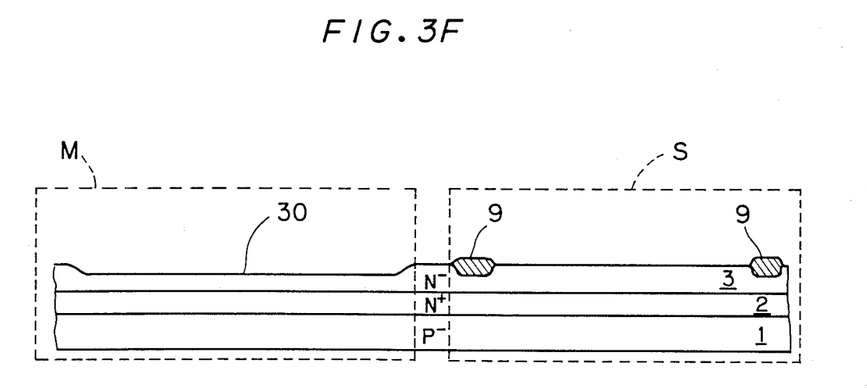
Figure 3G:
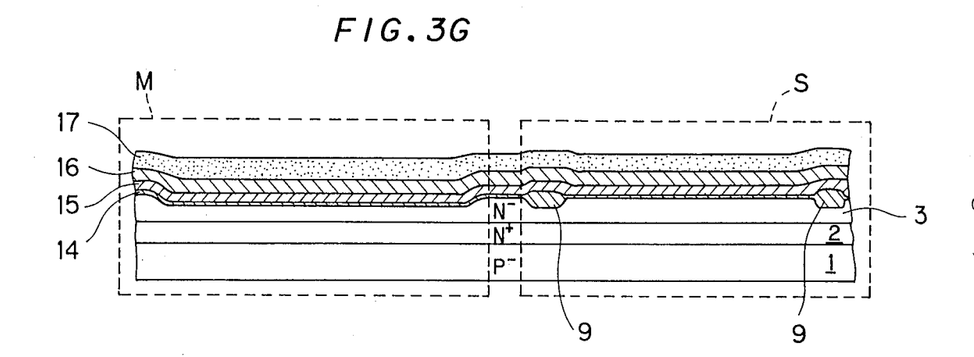

To say more precisely, an $SiO_2$ film 11, and $Si_3N_4$ film 12 and a resist film 13 are sequentially formed on he $N^-$-type collector layer 3, as shown in FIG. 3B. After a mask 14 having openings 14a, 14b and 14c in prescribed portions is provided above the resist film 13, light L is applied from above the mask 14. Thus, regions of the resist film 13 corresponding to the openings 14a, 14b and 14c of the mask 14 are exposed to the light L. Then, the exposed regions of the resist film 13 are removed, to thereby define a resist layers 13a, as shown in FIG. 3C. Thereafter the $SiO_2$ film 11 and the $Si_3N_4$ film 12 are selectively removed by utilizing the resist layers 13a as masks, to thereby form an $SiO_2$ layers 11a and an $Si_3N_4$ layers 12a, respectively. Then the resist layers 13a is removed, and the upper layer parts of the $N^-$-type collector layer 3 are selectively oxidized by utilizing the $SiO_2$ layers 11a and $Si_3N_4$ layers 12a as masks, to thereby form an $SiO_2$ layer 4 and $SiO_2$ layers 9, respectively, as shown in FIG. 3D. Thereafter the $SiO_2$ layers 11a and the $Si_3N_4$ layers 12a are removed, as shown in FIG. 3E. Then, the $SiO_2$ layer 4 is selectively removed to form a cavity 30 in an upper surface part of the $N^-$-type collector layer 3 corresponding to the memory element area M, as shown in FIG. 3F. Thus, the portion of the $N^-$-type collector layer 3 corresponding to the memory element area M is reduced in thickness, similarly to the aforementioned background art. Further, the distance between the semiconductor substrate 1 and wires is increased by forming of the $SiO_2$ layers 9, whereby parasitic capacitance across the semiconductor substrate 1 and the wires is reduced, and it is accordingly possible to get the semiconductor memory device of high-speed operation.

(3) Then, trench isolation members 10a to 10f are formed by a generally well-known trench isolation process, and element forming regions M1, M2, S1 and S2 are defined between adjacent pairs of the trench isolation members 10a to 10f, as shown in FIGS. 3G to 3K.

Figure 3H:
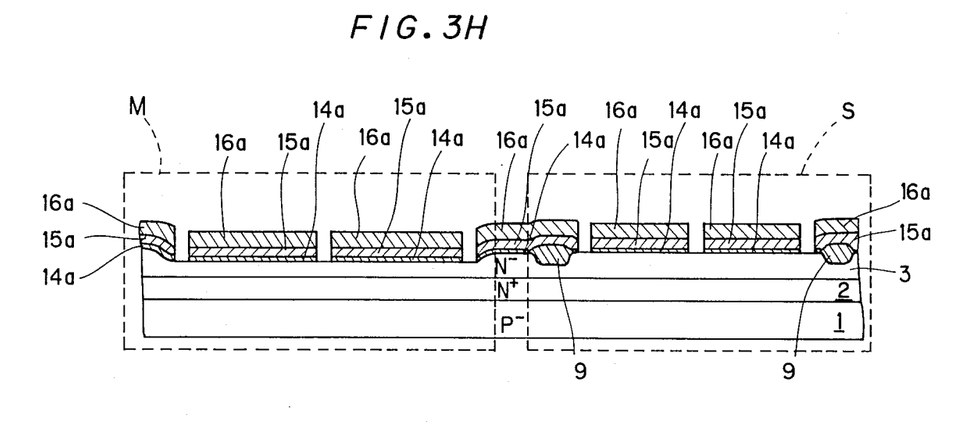
Figure 3I:
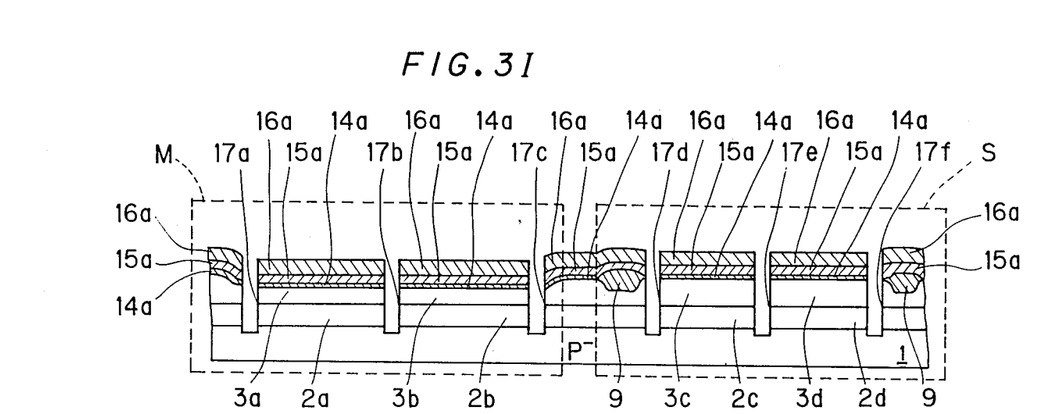
Figure 3J:
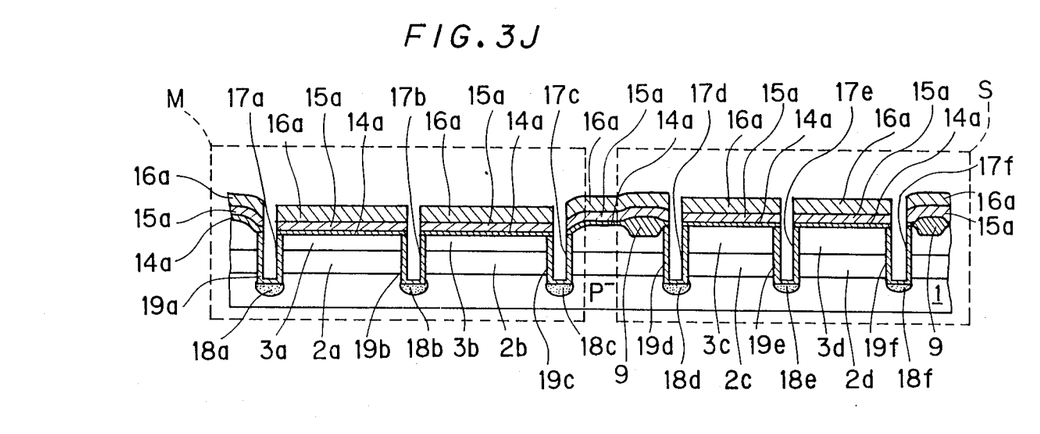
Figure 3K:
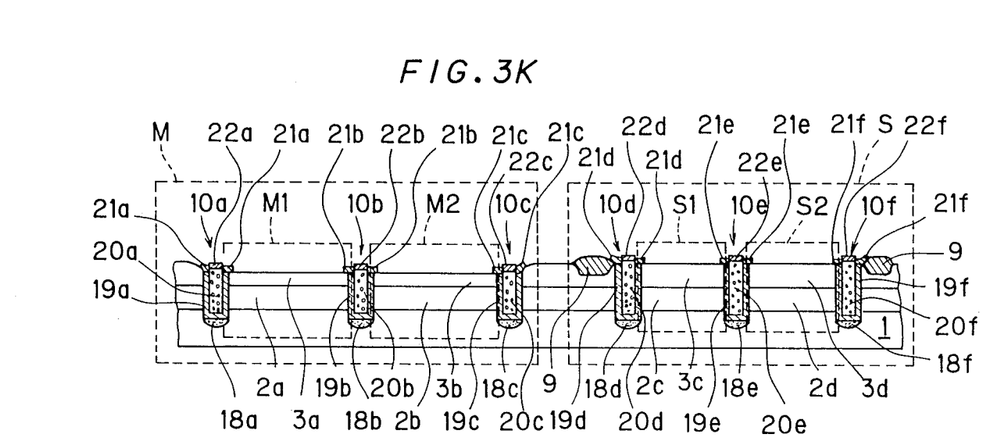

To say more precisely, an $SiO_2$ film 14, an $Si_3N_4$ film 15, a CVD-$SiO_2$ film 16 and a resist film 17 are sequentially formed on the $N^-$-type collector layer 3 and the $SiO_2$ layers 9. Then, the resist film 17 is patterned in a prescribed pattern by a photoengraving process. Thereafter the $SiO_2$ film 14, the $Si_3N_4$ film 15 and the CVD-$SiO_2$ film 16 are selectively removed by utilizing the patterned resist films as masks, to thereby form $SiO_2$ layers 14a, and $Si_3N_4$ layers 15a and CVD-$SiO_2$ layers 16a, respectively, as shown in FIG. 3H. After the patterned resist film is removed from the CVD-$SiO_2$ layer 16a, the $P^-$-type semiconductor substrate 1, the $N^+$-type subcollector layer 2 and the $N^-$-type collector layer 3 are selectively eched by utilizing the $SiO_2$ layers 14a, the $Si_3N_4$ layers 15a and the CVD-$SiO_2$ layers 16a as masks, to thereby form trenches 17a to 17f and to thereby form $N^+$-type subcollector regions 2a, 2b, 2c and 2d and $N^-$-type collector regions 3a, 3b, 3c and 3d, respectively. Thereafter inner wall surfaces of the trenches 17a to 17f are selectively oxidized, and a p-type impurity ion such as boron (B) are implanted into the semiconductor substrate 1 by utilizing the $SiO_2$ layers 14a, the $Si_2N_4$ layers 15a and the CVD-$SiO_2$ layers 16a masks from an upper space of the structure shown in FIG. 3I. Thus, $P^+$-type channel-cut regions 18a to 18f are formed in regions of the semiconductor substrate 1 corresponding to bottom portions of the trenches 17a to 17f, as shown in FIG. 3J. Then, the CVD-$SiO_2$ layers 16a and the oxide films formed on the inner wall surfaces of the trenches 17a to 17f are respectively removed, and the inner wall surfaces of the trenchs 17a to 17f are again selectively oxidized to form $SiO_2$ layers 19a to 19f therein. The aforementioned oxide films formed in the trenches 17a to 17f are removed and the $SiO_2$ layers 19a to 19f are again formed in the same positions since the oxide films formed before formation of the $P^+$-type regions 18a to 18f are damaged by the ion implantation performed for forming the $P^+$-type regions 18a to 18f, to thereby be reduced in insulability. Thereafter polysilicon is deposited on the $Si_3N_3$ layers 15a and the trenches 17a to 17f. Thus, polysilicon members 20a, 20b, 20c, 20d, 20e and 20f are filled in the trenches 17a to 17f, as shown in FIG. 3K. Then, respective surface parts of the polysilicon members 20a to 20f are removed by an etchback process to expose the surface of the $Si_3N_4$ layers 15a, and thereafter respective upper layer parts of the polysilicon members 20a to 20f left in the trenches 17a to 17f are selectively oxidized to form $SiO_2$ layers 22a, 22b, 22c, 22d, 22e and 22f therein, as shown in FIG. 3K. Then, the $Si_3N_4$ layers 15a are removed and the $SiO_2$ layers 14a and the $SiO_2$ layers 22a to 22f are coated with resist films, which in turn are patterned in prescribed patterns by the photoengraving process. Thereafter, parts of the $SiO_2$ layers 14a are selectively removed by utilizing the patterned resist films as masks, to thereby form $SiO_2$ layers 21a, 21b, 21c, 21d, 21e and 21f, as shown in FIG. 3K. Then, the patterned resist films are removed. Thus, a trench isolation member 10a is comprised of the $SiO_2$ layer 19a, the polysilicon member 20a filled in the trench 17a and the SiO2 layers 21a and 22a around the trench 17a, as shown in FIG. 3K. Other trench isolation member 10b to 10f are also formed respectively in a similar manner, whereby the element forming regions M1, M2, S1 and S2 are respectively isolated from peripheral regions thereof. Components forming the trench isolation members 10b to 10f are indicated by corresponding reference numerals, and redundant description is omitted.

Figure 3L:
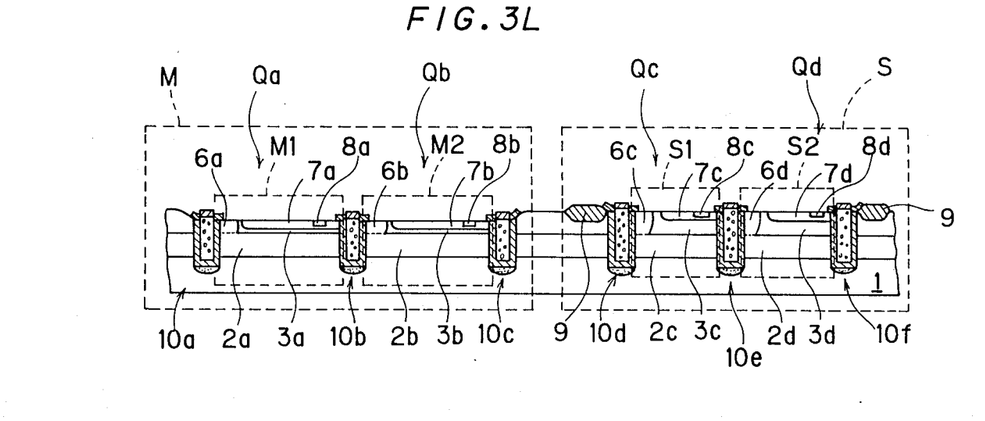

(5) Finally, bipolar transistors for forming memory cells are respectively provided in the element forming regions M1 and M2, while elements, such as transistors or resistors, for forming the peripheral circuit are respectively provided in the element forming regions S1 and S2 by generally well-known technique similarly to the case of the aforementioned proposal, as shown in FIG. 3L. Referrig to FIG. 3L, NPN bipolar transistors $Q_a$ and $Q_b$ for forming memory cells are provided in the element forming regions M1 and M2, while NPN bipolar transistors $Q_c$ and $Q_d$ for forming peripheral circuits are provided in the element forming regions S1 and S2, respectively. The NPN bipolar transistors $Q_a$ to $Q_d$ shown in FIG. 3L are identical to those shown in FIG. 2E, and hence redundant description is omitted.

In the method of manufacturing a semiconductor memory device according to the present invention, collector regions 3a, 3b ($N^-$-type collector layer 3) of the transistors $Q_a$ and $Q_b$ for forming memory cells are reduced in thickness, to thereby increase base-to-collector parasitic capacitance. Consequently, the critical charge amount is increased, and occurrence of soft errors is accordingly reduced.

Further, the trench isolation members 10a to 10f are formed to isolate the element forming regions M1, M2, S1 and S2 from each other, whereby the degree of integration of the semiconductor memory device can be improved.

In addition, the $SiO_2$ layers 9 are provided to increase the distance between the semiconductor substrate 1 and wires, whereby parasitic capacitance across the semiconductor substrate 1 and the wires is reduced, and it is accordingly possible to get the semiconductor memory device of high-speed operation.

Further, the $SiO_2$ layer 4 is simultaneously formed with the $SiO_2$ layers 9, whereby mask alignment can be performed only once, to thereby further increase the degree of integration of the semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device comprising a memory element area formed by a plurality of bipolar transistors in a first area of a first conductivity type semiconductor substrate and a peripheral circuit area formed by a plurality of circuit elements in a second area of said semiconductor substrate, said method comprising:
    a first step of preparing said semiconductor substrate;
    a second step of forming a second conductivity type subcollector layer on said semiconductor substrate;
    a third step of forming a second conductivity type collector layer on said second conductivity type subcollector layer;
    a fourth step of simultaneously forming first and second insulation layers in a region corresponding to said memory element are and regions corresponding to prescribed regions of said peripheral circuit area within an upper layer part of said second conductivity type collector layer;
    a fifth step of selectively removing said first insulation layer; and
    a sixth step of isolating regions for forming said plurality of bipolar transistors from each other and isolating regions for forming said plurality of circuit elements from each other respectively by a trench isolation process.

2. A method of manufacturing a semiconductor memory device in accordance with claim 1, wherein
    said collector layer is formed by an epitaxial growth method in said third step.

3. A method of manufacturing a semiconductor memory device in accordance with claim 1, wherein
    said first and second insulation layers are made of oxide.

4. A method of manufacturing a semiconductor memory device in accordance with claim 1, wherein
    said first and second insulation layers are formed by a LOCOS process in said fourth step.

* * * * *